United States Patent [19]

McNamara et al.

[11] Patent Number: 5,516,625
[45] Date of Patent: May 14, 1996

[54] FILL AND ETCHBACK PROCESS USING DUAL PHOTORESIST SACRIFICIAL LAYER AND TWO-STEP ETCHING PROCESS FOR PLANARIZING OXIDE-FILLED SHALLOW TRENCH STRUCTURE

[75] Inventors: Jeanne M. McNamara; Deborah K. Rodriguez; David H. Leebrick, all of Palm Bay, Fla.

[73] Assignee: Harris Corporation, Melbourne, Fla.

[21] Appl. No.: 118,063

[22] Filed: Sep. 8, 1993

[51] Int. Cl.$^6$ .................................................. G03F 7/26
[52] U.S. Cl. .................. 430/314; 437/67; 437/72; 156/643.1; 156/648.1; 156/649.1; 156/655.1; 156/657.1; 156/659.11; 156/662.1
[58] Field of Search ................ 430/314; 437/67, 437/72; 156/643, 648, 649, 655, 657, 659.1, 662

[56] References Cited

U.S. PATENT DOCUMENTS

| | | | |
|---|---|---|---|
| 4,307,179 | 12/1981 | Chang et al. | 430/314 |
| 4,464,459 | 8/1984 | Majima et al. | 430/314 |
| 4,811,079 | 3/1989 | Turina et al. | 156/651 |

FOREIGN PATENT DOCUMENTS

| | | | |
|---|---|---|---|
| 2224861 | 5/1990 | United Kingdom | 430/314 |

OTHER PUBLICATIONS

IBM Tecnical Disclosure Bulletin vol. 27, No. 2, Jul. 1984 Double Planar Polyimide Process, Kent.

*Primary Examiner*—Lee C. Wright
*Attorney, Agent, or Firm*—Charles E. Wands

[57] ABSTRACT

To planarize an oxide-filled shallow trench-isolated semiconductor architecture, a composite photoresist sacrificial layer is initially formed on the oxide-filled structure. The composite photoresist layer contains photoresist plugs which are reflowed to fill depressions in the oxide fill layer overlying the trench, and an overlying photoresist layer which effectively planarizes the depression-filled trench oxide layer. Respective photoresist and oxide selective etching chemistries are then successively applied to first etch the composite sacrificial photoresist layer and then etch the trench fill oxide layer down to the surface of an etch stop polysilicon layer. Since the thickness of the polysilicon etch stop layer is initially formed so as to extend above the mesa layer of the trench-isolated semiconductor structure by a relatively nominal height, after planarization, the top surface of the trench fill oxide layer still extends above the surface of the mesa to prevent shorting of a subsequently formed polysilicon gate layer with underlying mesa material, while being sufficiently low enough to avoid sidewall stringer formation.

12 Claims, 6 Drawing Sheets

5,516,625

FILL AND ETCHBACK PROCESS USING DUAL PHOTORESIST SACRIFICIAL LAYER AND TWO-STEP ETCHING PROCESS FOR PLANARIZING OXIDE-FILLED SHALLOW TRENCH STRUCTURE

FIELD OF THE INVENTION

The present invention relates in general to the manufacture of integrated circuit architectures, and is particularly directed to a process for planarizing an oxide-filled shallow trench semiconductor structure, by forming a photoresist sacrificial layer that contains a first photoresist layer portion which fills depressions in a non-selectively deposited trench fill oxide layer, and a second photoresist layer portion which effectively planarizes the depression-filled trench oxide layer, followed by etching the sacrificial photoresist and oxide layers using a two step selective etch process.

BACKGROUND OF THE INVENTION

As the dimensions (line widths) of integrated circuits continue to decrease, the planarization of a semiconductor architecture continues to be critical to the successful formation of its topographical features, such as trench isolation and one or more layers of (polysilicon) interconnect. For example, polysilicon is typically non-selectively deposited and then selectively etched to form a prescribed conductor pattern on the surface of semiconductor structure. If the surface on which the polysilicon is deposited is not planar, then, after a selective etch, any polysilicon that remains in uneven areas of the non-planar surface, such as in depressions or alongside high aspect ratio mesa regions, may form unwanted 'stringers' that extend over and undesirably interconnect or effectively short together two or more portions of the integrated circuit structure.

Additionally, if the surface level of the trench fill oxide is below the surface of its adjacent mesa structure, a conductive layer that overlies the trench fill oxide and is to be formed on a thin (e.g. gate) insulator layer terminating at the trench edge may be shorted to the underlying mesa material just below the lip of the trench. Of course, since the depth of focus of photolithographic equipment is limited, it is essential that the topography of the structure be as planar as possible in order to accurately image a given circuit pattern on the semiconductor surface to be processed.

One proposed methodology for planarizing the surface of an oxide-filled, trench-isolation semiconductor architecture, such as that described, for example, in an article by T. H. Daubenspeck et al, entitled "Planarization of ULSI Topography over Variable Pattern Densities," Journal of the Electrochemical Society, Vol. 138, No.2, February 1991, pp 506–509 involves 'ideally' defining the composition of the etch chemistry, so as to equalize the etch rate of a sacrificial photoresist layer and the etch rate of oxide material contiguous with the photoresist material. We have found, however, that such a process is very unstable, being sensitive to the history of the operation of the etching chamber, so that the chamber would have to be seasoned in order to maintain the desired etch rate balance. Unfortunately, however, it turns out that seasoning the etching chamber is not an effective solution, since the original seasoning becomes degraded and is continuously modified as the conditions within the chamber change during the process. In particular, the original chamber chemistry that has been prepared for a global one-to-one etch rate of photoresist and oxide designed process becomes locally sensitive to the loading effect of oxide, which causes photoresist to be etched more rapidly than the oxide, thereby creating an undulating surface contour.

Another proposed technique uses a complicated series of etch steps that are intended to maintain an optimum (ideally one-to-one) etch selectivity to correct for loading effects, or by flowing either a photoresist plug, or a flowable oxide film (e.g. SOG OR BPSG) in valleys of the undulating surface of the oxide in an attempt to create a final planarized overlay. A principal disadvantage of this process is the need to develop etch chemistries that can maintain a prescribed etch rate selectivity to diverse composition portions of the planarization overlay being etch (e.g. photoresist (PR) vs. BPSG), PR vs. SOG, BPSG vs. USG, etc.). Moreover manufacturability of the process is extremely sensitive to the repeatability of prior processes carried out in the etch chamber.

Still another suggested scheme simply overfills the trench with non-selectively deposited oxide and then relies on plasma smoothing to remove the final fill material in an attempt to remove or decrease any 'grooving' of the trench oxide fill. However, long exposure times of 'seamed' oxides tend to exaggerate, rather than lessen, groove formation.

In addition to the problems discussed above, traditional planarization processes which employ a batch reactor suffer from typical batch reactor nonuniformities, which produce device yield losses for both under etched and overetched regions of the semiconductor structure.

SUMMARY OF THE INVENTION

In accordance with the present invention, the above described shortcomings of conventional methodologies for planarizing an oxide-filled shallow trench-isolated semiconductor architecture are effectively obviated by first forming a composite sacrificial photoresist layer that contains reflowed photoresist plugs which fill depressions in a non-selectively deposited trench fill oxide layer, and a topside photoresist layer portion which effectively planarizes the depression-filled trench oxide layer. After formation of the dual photoresist sacrificial layer, the sacrificial photoresist and oxide layers are sequentially etched using respective photoresist- and oxide-selective etch chemistries.

More particularly, the planarization process according to the present invention comprises non-selectively forming a trench fill oxide layer on a trench-isolated semiconductor structure, for example by chemical vapor deposition, the top surface of the trench-isolated semiconductor structure containing an arrangement of mesa regions on which polysilicon has been formed and a trench pattern which extends from the top surface into the substrate down to some prescribed depth (through the semiconductor island thickness to an underlying oxide layer). As a non-limitative example the semiconductor structure that is to be subjected to the planarization process of the invention may comprise a silicon-on-insulator architecture, which includes an underlying handle semiconductor wafer having a buried silicon oxide layer.

Formed on the top surface of the buried oxide layer is a single crystal semiconductor mesa layer, in which circuit regions of the intended integrated circuit architecture are to be formed. A thin oxide layer is formed on the top surface of the silicon mesa layer. A polysilicon layer, which is to serve as an etch stop layer and is eventually stripped from the trench filled architecture, is formed on the top surface of the thin oxide layer. The thickness of the etch stop polysilicon layer is predefined to take into account subsequent wash treatments to which a trench fill oxide, that is initially formed so that it is coplanar with the top surface of the polysilicon layer, will be exposed, so that even after being slightly etched by the wash treatments, the top surface of the trench fill oxide will not be lower than the top surface of the mesa.

For a trench-isolated SOI structure, the silicon mesa layer is subdivided into a plurality of dielectrically isolated islands in which active devices (MOSFETs, bipolar devices, etc.) are to be formed, by etching a pattern of trenches through the mesa structure to the underlying oxide layer. Next, the exposed surface of the trench-patterned mesa architecture is oxidized to form a thin oxide layer on the exposed surfaces of the trench and the polysilicon layer. A trench fill oxide layer is then non-selectively deposited such that it completely fills the trench and overlies the mesa regions of the top surface of the substrate. Because the surface topography of the deposited oxide fill layer is substantially conformal with the topography of the trench-patterned surface of the underlying semiconductor structure, the top surface of the oxide fill layer will have depressions which overlie the trenches. The oxide fill layer is deposited to a thickness sufficient to ensure that the bottoms of the surface depressions are located above the top surface of the mesas of the underlying structure. For this purpose, an undoped TEOS-based oxide layer may be non-selectively deposited by chemical vapor deposition. After deposition, the oxide fill layer is heated to densify the layer.

After increasing the density of the oxide fill layer, a dual layer photoresist sacrificial planarizing layer is formed atop the oxide fill layer in order to effectively planarize the depression-containing trench oxide fill layer. The dual photoresist layer is formed by selectively forming a first photoresist layer on the top surface of the trench oxide fill layer in the portions which contain depressions, so as to form a plurality of photoresist plugs. The photoresist plugs fill the depressions in the oxide layer and extend a sufficient height above the top surface of the oxide fill layer, so as to allow the photoresist plug material to be reflowed into a generally smooth and substantially planar shape that blends into an intended planar surface contour with the top surface of the oxide layer.

The photoresist plugs are reflowed into more gradually tapered, generally conformal 'bubbles' which have a generally smooth and slightly convex shape that smoothly blends into the intended planar surface contour of the top surface of the oxide layer. Then, a second photoresist layer is formed over the entire wafer, covering both the previously reflowed plugs and trench fill oxide layer. This second layer of resist produces a globally planar top surface. This more globally planar dual photoresist layer topography enables a subsequent two step etch process to realize the desired planar trench fill profile.

Once the dual photoresist layer has been formed, it is etched using an oxygen-based chemistry, so as to rapidly remove the sacrificial photoresist composite structure down to and terminating at the top surface of the trench oxide fill layer. Because the photoresist etch chamber parameters are precisely controllable, etching through the dual photoresist layer to an end point coincident with the top surface of the oxide fill layer leaves an etched back, planarized portion of the photoresist plug overlying the trench that is top surface-conformal with the exposed top surface of the fill layer.

Following the removal of substantially all of the sacrificial dual photoresist layer, save the unetched portions of the planarized reflowed plugs below the exposed top planar surface of the oxide layer, an oxide etchant, such as $NF_3/CHF_3$, is applied so as to anisotropically etch the oxide layer down to and terminating at the surface of etch stop polysilicon layer.

As in the case of the etch of the dual photoresist layer, the chemistry of the $NF_3/CHF_3$ oxide etchant is defined so as to optimize its selectivity to oxide, thereby enabling the vertical etch of oxide layer and underlying contiguous oxide layer to terminate precisely at the top surface of the etch stop polysilicon layer.

Upon completion of the two step, selective chemistry planarization etch process, the remaining photoresist plug material which overlies the surface of oxide material within the trench and is coplanar with the top surface of polysilicon layer is stripped away. Removal of the remaining photoresist leaves a planarized surface topology in which the top surface of the polysilicon layer is coplanar with the top surface of oxide fill layer in the trench.

Next, a polysilicon wet etch is applied so as to strip the polysilicon layer from the surface of the oxide-filled trench isolation structure. During the polysilicon strip step, the top surface of the trench fill oxide and the thin oxide layer will be slightly etched down so as to reduce the thickness of the trench fill and the oxide. Yet, because the original thickness of the polysilicon etch stop extended above the mesa layer by a predetermined height, the oxide's top surface still extends above the surface of the mesa a sufficient height to prevent shorting of a subsequently formed polysilicon gate with the mesa, while not creating an aspect ratio that would cause sidewall stringer formation. The height of the top surface of the trench oxide fill layer will ensure that subsequent gate oxide preparation wash steps, there will be adequate trench oxide thickness to prevent its top surface from having a height less than the top surface of the mesa layer.

DETAILED DESCRIPTION

The planarization process according to the present invention will now be described with reference to FIGS. 1–10, which are cross-sectional illustrations of a trench-isolated semiconductor architecture at respective steps of the inventive process for obtaining an effectively planarized topography. By effectively planarized topography for trench-isolated semiconductor architecture is meant a surface topography in which the target thickness of trench oxide fill material, at the completion of the planarization sequence, will have been quantitatively established to be slightly (on the order of hundreds of Angstroms) higher than the top surface of an adjacent mesa layer. This slightly greater thickness of trench oxide fill is such that subsequent processing (which includes very limited erosion) of the trench oxide in preparation of the formation of a patterned polysilicon (gate conductor) layer will predictably produce a trench oxide surface that will substantially coincide with the top surface of the mesa, so that the above described problems of unwanted poly stringer formation and gate shorting beneath the trench lip do not occur.

Figure 1:
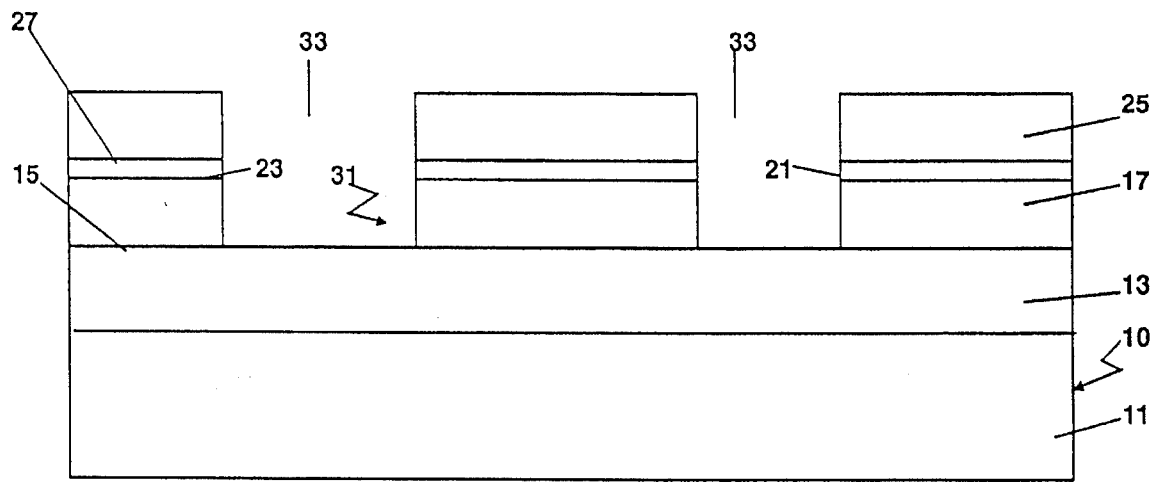
FIGS. 1–10 are cross-sectional illustrations of a trench-isolated semiconductor architecture at respective steps of the inventive process for obtaining an effectively planarized topography according to the present invention.

FIG. 1 shows a non-limitative semiconductor structure that is to be subjected to the planarization process of the invention comprising a silicon-on-insulator (SOI) architecture 10, which includes an underlying support or handle semiconductor wafer 11 having a buried insulator (silicon oxide) layer 13. It should be observed, however, that the structure to which the processing method of the present invention is applied need not be a dielectrically isolated SOI structure. Other device structures, such as a bulk material may be employed.

Formed on the top surface 15 of buried insulator layer 13 is a semiconductor (mesa) layer 17 in which circuit regions that make up the intended integrated circuit architecture are to be formed. Semiconductor layer 17 may comprise a single crystal silicon layer formed by an epitaxial silicon deposition system, deposited to a thickness on the order of 4000 Angstroms. A thin (oxide layer thickness on the order of 350 Angstroms) oxide layer 21 is formed on the top surface 23 of silicon mesa layer 17 and a polysilicon layer 25, which is to serve as an etch stop layer, as will be described, is formed on the top surface 27 of thin oxide layer 21. Etch stop polysilicon layer 25 may have a thickness on the order of 2000 Angstroms.

Figure 2:
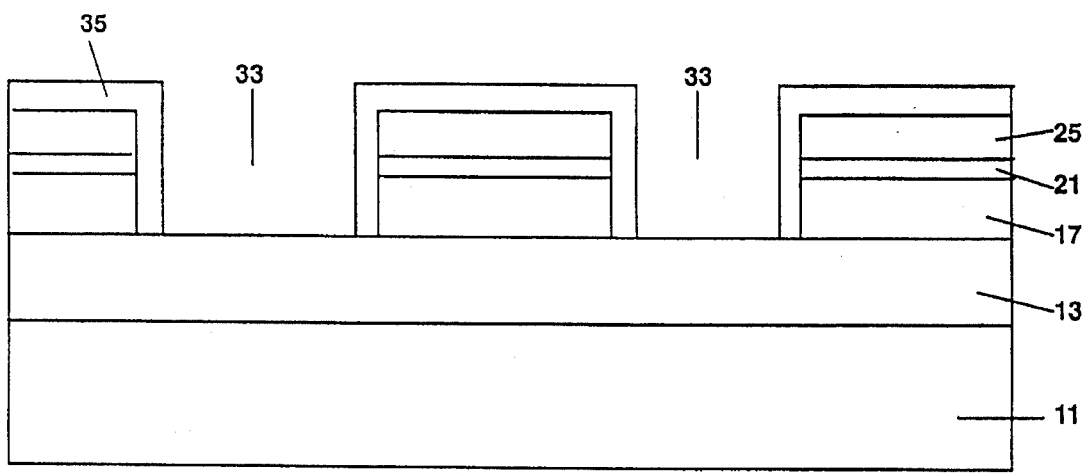

In the present example of a trench-isolated SOI structure, silicon mesa layer 17 is subdivided into a plurality of dielectrically isolated islands 31, in which active devices (MOSFETs, bipolar devices, etc.) are to be formed, by etching a pattern of trenches 33 through the mesa structure to the underlying oxide layer 13. Trench pattern 33 may be etched in the mesa silicon material by using an AME 8100 series batch reactor. Next, as shown in FIG. 2, the exposed surface of the trench-patterned mesa architecture is oxidized to form a thin oxide layer 35 (having a thickness on the order of 350 Angstroms) is formed on the exposed surfaces of trench 33 and polysilicon layer 25. Eventually, polysilicon layer 25 will be removed, so that the trench fill oxide will extend slightly above the surface of the island regions.

Figure 3:
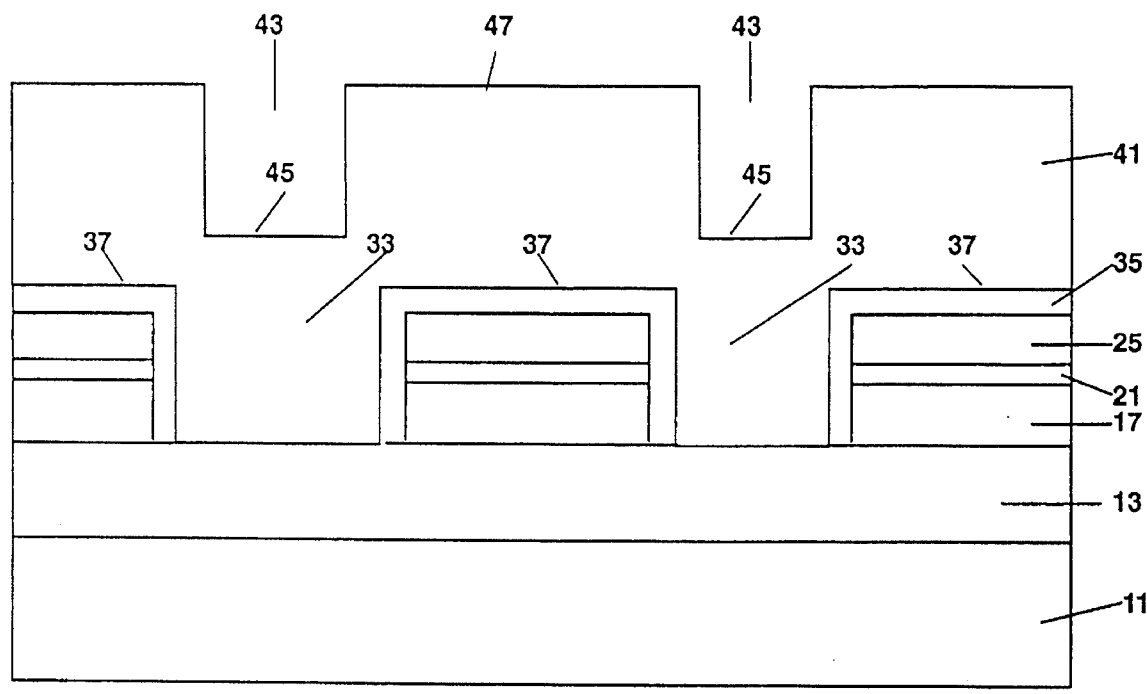

Next, as shown in FIG. 3, a trench fill oxide layer 41 is non-selectively deposited such that it completely fills the trench 33 and overlies the mesa regions of the top surface of the substrate. Because the surface topography of the deposited oxide fill layer 41 is substantially conformal with the topography of the trench-patterned surface of the underlying semiconductor structure, the top surface 47 of oxide fill layer 41 will have depressions or recesses 43, which overlie the trenches 33. The oxide fill layer 41 is deposited to a thickness sufficient to ensure that the bottoms 45 of the surface depressions 43 are located above the top surface 37 of the mesas of the underlying structure. For this purpose, an undoped TEOS-based oxide layer may be non-selectively deposited by chemical vapor deposition to a thickness on the order of 7000 Angstroms. After deposition, oxide fill layer 41 is heated to a temperature on the order of 875 degrees, for 30 minutes, in order to densify the oxide fill layer.

After increasing the density of the oxide fill layer, a dual or two-layer portion photoresist sacrificial planarizing layer is formed atop the oxide fill layer 41 in order to effectively planarize the depression-containing trench oxide fill layer. (For a description of an example of the basic mechanism for forming a two-layer photoresist planarizing layer to enhance the planarization quality of a sacrificial photoresist overlay, attention may be described to an article by A. Schiltz et al, entitled "Two-layer Planarization Process," Journal of the Electrochemical Society, Solid-State Science and Technology, Vol. 133, No 1, January, 1986, pp 178–180.)

Figure 4:
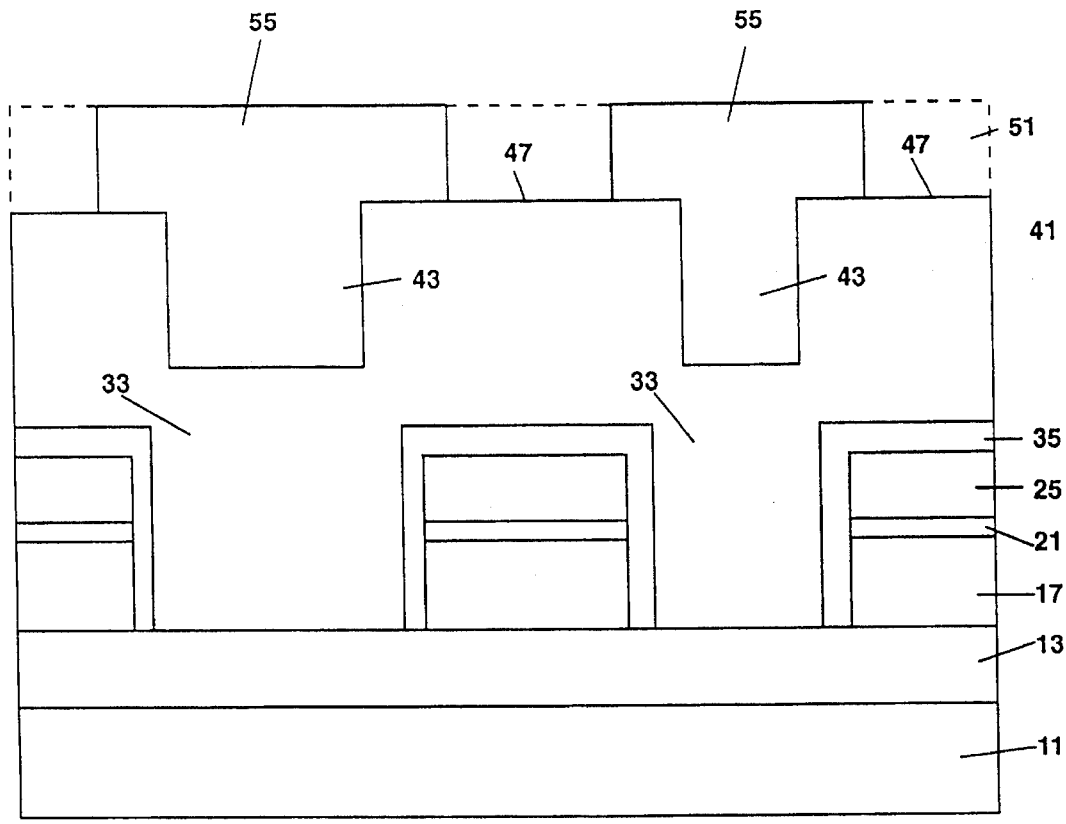

In the process according to the present invention, formation of a dual photoresist layer is achieved by selectively forming (via a conventional mask, expose and develop sequence) a first photoresist layer 51 on the top surface 47 of trench oxide fill layer 41 to obtain a plurality of photoresist plugs 55, as diagrammatically illustrated in FIG. 4. Photoresist plugs 55 fill depressions 43 and extend a sufficient height (e.g. 5000 Angstroms) above the top surface 47 of oxide fill layer 41, so as to allow the photoresist plug material to be reflowed into a generally smooth and substantially planar shape that blends into an intended planar surface contour with the top surface 47 of oxide layer 41. To reflow the photoresist plugs 55, the structure shown in FIG. 4 is heated to a temperature on the order of 250° C, for 30 minutes in air.

Figure 5:
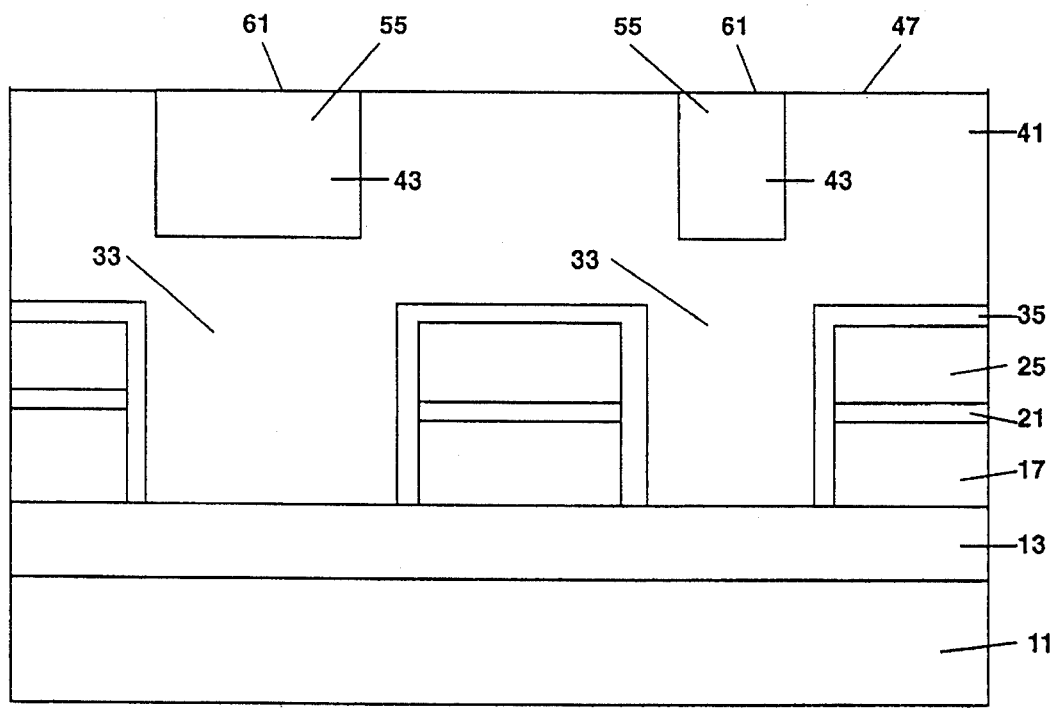

FIG. 5 shows the result of reflowing the photoresist plugs 55 into more gradually tapered, generally conformal 'bubbles' 61, which have a generally smooth and slightly convex shape that smoothly blends into the intended planar surface contour of the top surface 47 of oxide layer 41.

Figure 6:
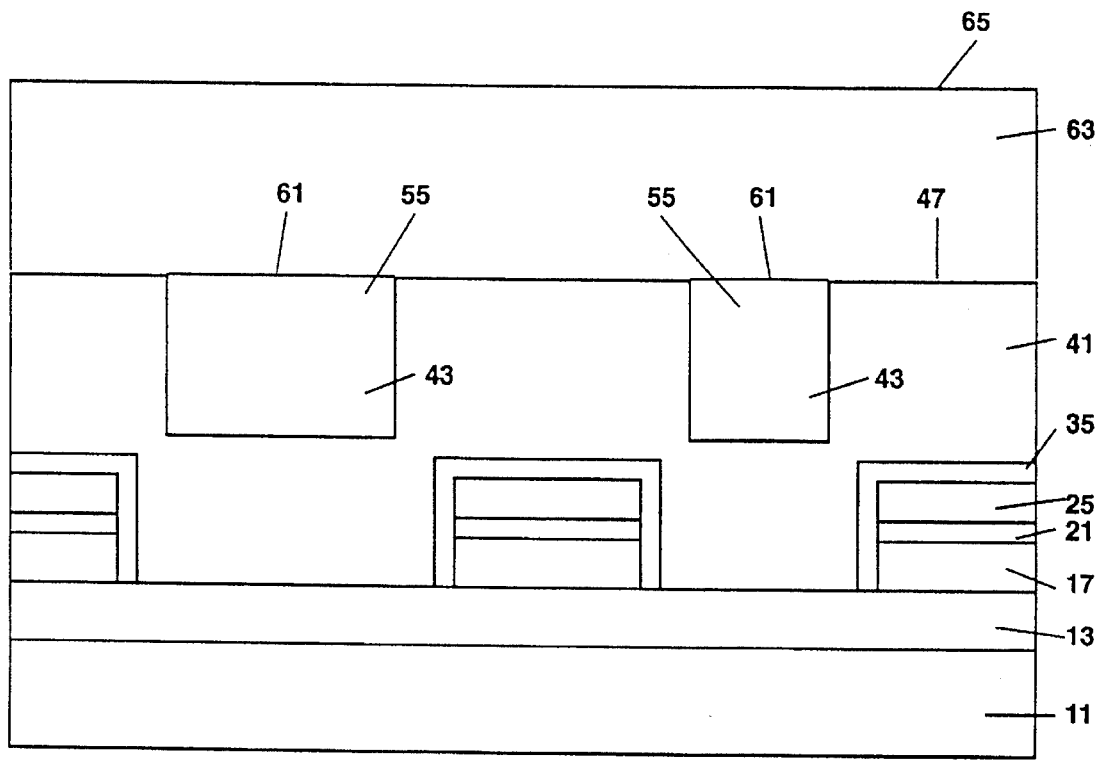

After reflowing the photoresist plugs 55, a relatively thick (e.g. on the order of 7000 Angstroms) second photoresist layer 63 is non-selectively formed atop the structure of FIG. 5, so as to provide a highly planarized top sacrificial photoresist layer, as shown in FIG. 6. As can be seen from a comparison of the topography of FIGS. 3 and 6, the effect of flowing the photoresist plugs 55 into gradually tapered slightly convex bubbles 61 that have a very low aspect ratio (on the order of 2000 Angstroms) causes the top surface 65 of second photoresist layer 63 to have a more globally planar topography than the conformal oxide layer 41 having the deeper (high aspect ratio) depressions 43. As will be described, the more globally planar topography of composite photoresist layer, formed of reflow plugs 55 and topside photoresist layer 63 enables a subsequent two step etch process to realize the desired planar trench fill profile.

Figure 7:
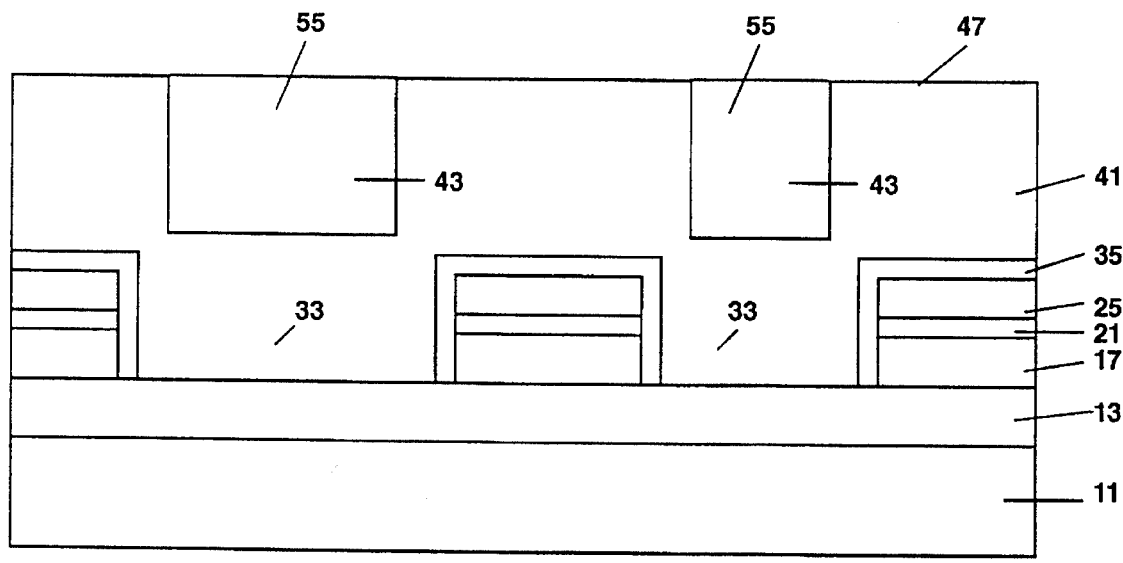

Once the dual photoresist layer has been formed, it is etched using an oxygen-based chemistry, such as $O_2/NF_3$, at a temperature of 20° C., at a pressure of 50 millitorr, for 60 seconds, so as to rapidly remove the sacrificial photoresist composite structure down to and terminating at the top surface 47 of trench oxide fill layer 41, as shown in FIG. 7. Because the photoresist etch chamber parameters are precisely controllable, etching through the dual photoresist layer to an end point coincident with the top surface 47 of oxide layer 41 leaves an etched back, planarized portion of the photoresist plug 55 overlying trench 33, that is top surface-conformal with the exposed top surface 47 of oxide layer 41.

Figure 8:
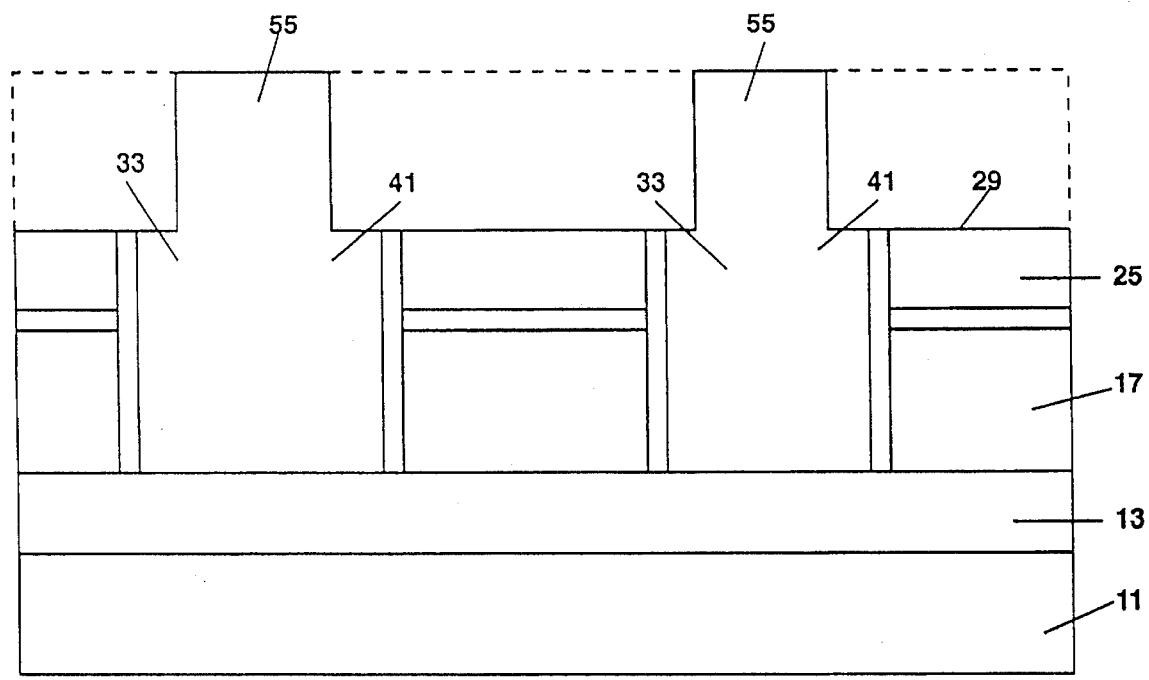

Following the removal of substantially all of the dual sacrificial photoresist layer, save the unetched portions of the planarized reflowed plugs 55 below the exposed top planar surface 47 of oxide layer 41, an oxide etchant, such as $NF_3/CHF_3$, is applied to the structure of FIG. 7, in a functionally anisotropic manner to etch the oxide layer 41 down to and terminating at the top surface 29 of etch stop polysilicon layer 25. As in the case of the previous etch of the dual photoresist layer, the chemistry of the $NF_3/CHF_3$ oxide etchant is defined so as to optimize its selectivity to oxide, thereby enabling the vertical etch of oxide layer 41 (and underlying contiguous oxide layer 35) to terminate precisely at the etch stop top surface 29 of polysilicon layer 25, as shown in FIG. 8. For this purpose, the following process parameters may be employed: power=100–1000 Watts; pressure=40–70 millitorr; a magnetic field of up to 100 Gauss; and a $CHF_3/NF_3$ ratio of 8.33:1–6.25:1.

Upon completion of the two step, selective chemistry planarization etch process, the remaining photoresist plug material 55 which overlies the surface of oxide material within the trench 33 and is coplanar with the top surface of polysilicon layer 25, is stripped away, for example by the application of an $H_2SO_4/H_2O_2$ photoresist wash. Removal of the remaining photoresist leaves a planarized surface topology as shown in FIG. 9, in which the top surface 29 of etch stop polysilicon layer 25 is coplanar with the top surface 46 of oxide fill layer 41 in trench 33.

Figure 9:
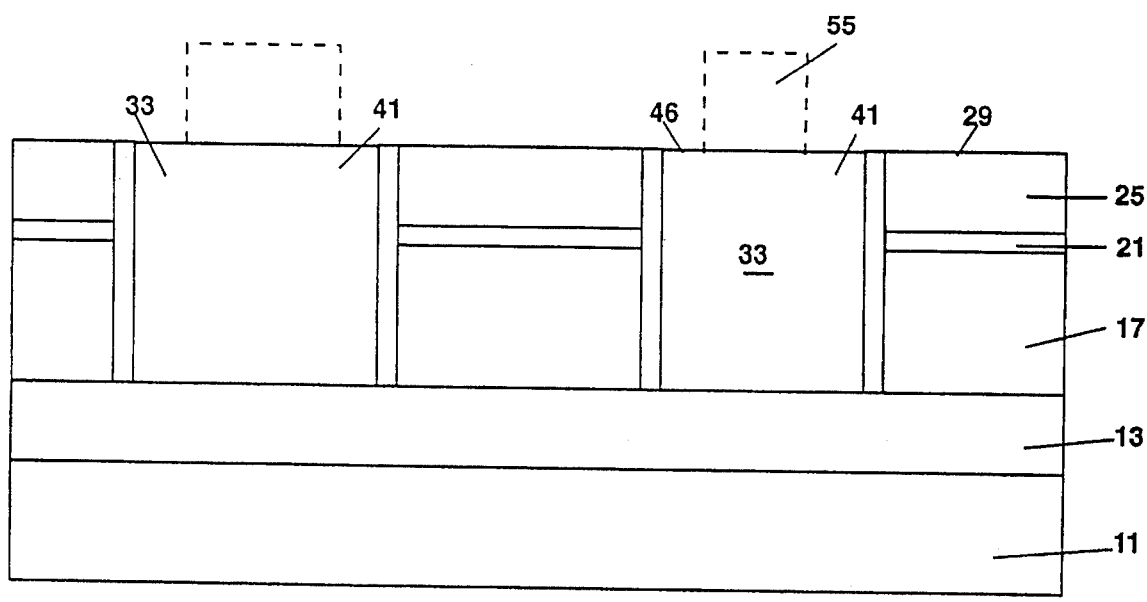
Figure 10:
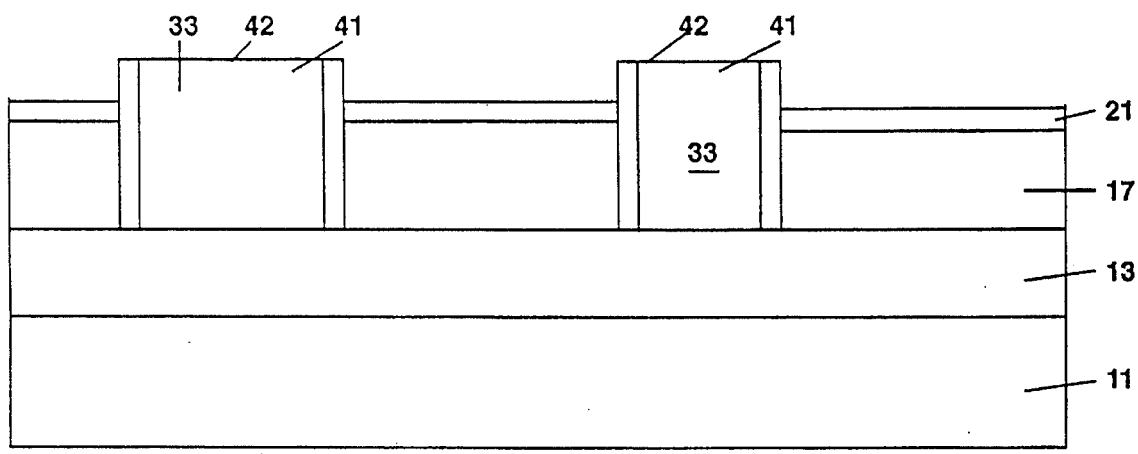

Next, a polysilicon wet etch such as KOH at 80° C. is applied to the structure of FIG. 9, so as to strip the polysilicon layer 25 from the surface of the oxide-filled trench isolation structure, and obtain the topography shown in FIG. 10. During the polysilicon strip step, the top surface of the trench fill oxide 41 and the thin oxide layer 21 will be slightly etched so as to reduce the thickness of the trench fill and the oxide 21. Yet, because the original thickness of the polysilicon film extended above the mesa layer 17 by a predetermined height on the order of 2000 Angstroms pre-etch (1000–1500 post-etch including overetch), the top surface 42 of trench fill oxide 41 still extends above the surface of the mesa a sufficient height to prevent shorting of a subsequently formed polysilicon gate with the mesa, while the less than 1000 Angstroms (e.g. on the order of 800 Angstroms) height will avoid sidewall stringer formation. The approximately 800 Angstrom height of the top surface of the trench oxide fill layer will ensure that subsequent to additional gate oxide preparation wash steps, there will be adequate trench oxide thickness to prevent its top surface from having a height less than the top surface of the mesa layer 17.

As will be appreciated from the foregoing description, the previously described shortcomings of conventional processes for planarizing an oxide-filled shallow trench-isolated semiconductor architecture are effectively obviated in accordance with the present invention by forming a composite photoresist sacrificial layer that contains reflowed photoresist plugs which fill depressions in a non-selectively deposited trench fill oxide layer, and an overlying photoresist layer which effectively planarizes the depression-filled trench oxide layer, and then using respective photoresist and oxide selective etching chemistries to successively etch the sacrificial photoresist and trench fill oxide layers down to the surface of an etch stop polysilicon layer.

Since the thickness of the polysilicon etch stop layer is initially formed so as to extend above the mesa layer of the trench-isolated semiconductor structure by a relatively nominal height, after planarization, the top surface of the trench fill oxide layer still extends above the surface of the mesa to prevent shorting of a subsequently formed polysilicon gate layer with underlying mesa material, while being sufficiently low enough to avoid sidewall stringer formation.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of forming a semiconductor structure comprising the steps of:

(a) providing a substrate having a top surface and a trench which extends from said top surface into said substrate;

(b) non-selectively forming a first layer of a first material on the structure provided in step (a) such that said first layer of said first material fills said trench and is formed on said top surface of said substrate, and wherein a depression extends from a top surface of said first layer of said first material, said depression overlying said trench;

(c) filling the depression in said first layer of said first material with a second layer of a second material such that said second layer of said second material has a top surface that substantially coincides with the top surface of said first layer of said first material;

(d) non-selectively forming a third layer of said second material on the structure resulting from step (c) such that said third layer of said second material forms a planarizing top layer structure overlying said first and second layers;

(e) etching second material of said third layer and said second layer down to the surface of said first layer;

(f) etching first material of said first layer down to the top surface of said substrate, so as to leave second material of said second layer overlying first material filling said trench; and (g) removing second material of said second layer overlying first material filling said trench.

2. A method according to claim 1, wherein step (e) comprises non-selectively applying a first etchant, which etches said second material, to the structure resulting from step (d), so as to etch said third layer and said second layer down to the surface of said first layer, and step (f) comprises non-selectively applying a second etchant, which etches said first material, to the structure resulting from step (e), so as to etch said first material of said first layer down to the top surface of said substrate, and leave second material of said second layer overlying first material filling said trench.

3. A method according to claim 2, wherein step (a) comprises providing a semiconductor substrate having a layer of polysilicon formed on a top surface thereof and a trench which extends from a top surface of said layer of polysilicon into said substrate, and further including the step of:

(h) removing said layer of polysilicon from said top surface of semiconductor substrate so that said first material filling said trench projects above said top surface of said semiconductor substrate.

4. A method of forming a semiconductor structure comprising the steps of:

(a) non-selectively forming a trench fill material layer on a trench-patterned semiconductor structure, said trench-patterned semiconductor structure containing mesa regions on which an etch stop layer has been formed and a trench pattern which extends from a top surface said trench-patterned semiconductor structure down to a prescribed depth therein, said trench fill material layer being substantially conformal with the topography of the trench-patterned surface of the underlying semiconductor structure, such that the top surface of said trench fill material layer has depressions which overlie said trench pattern, said trench fill material layer having a thickness sufficient to ensure that said depressions are located above the top surface of said mesa regions;

(b) selectively forming a plurality of photoresist plugs which fill the depressions in the top surface of said trench fill material layer and extend above the top surface of said trench fill material layer, so as to allow said photoresist plugs to be reflowed into a generally smooth and substantially planar shape that blends into an intended planar surface contour with the top surface of said trench fill material layer;

(c) reflowing said photoresist plugs into a shape which smoothly conforms with the top surface of the oxide layer;

(d) non-selectively forming a planarizing photoresist layer on the structure resulting from step (c), so as to form a composite photoresist sacrificial layer structure containing said planarizing photoresist layer and reflowed photoresist plugs;

(e) etching said composite photoresist sacrificial layer down to and terminating at the top surface of the trench fill material layer, so as to produce a planarized surface containing the top surface of said trench fill material and planarized top surface portions of said reflowed photoresist plugs that have formed in the depressions in the top surface of said trench fill material overlying said trench pattern;

(f) anisotropically etching said trench fill material layer down to and terminating at the surface of said etch stop layer, which leaves a plurality of reflowed photoresist plugs overlying said trench pattern and being coplanar with the top surface of said etch stop layer;

(g) removing said plurality of reflowed photoresist plugs overlying said trench pattern; and (h) removing said etch stop layer.

5. A method according to claim 4, wherein said trench fill material comprises a trench fill oxide, and said etch stop layer comprises polysilicon.

6. A method according to claim 5, wherein said trench-patterned semiconductor structure comprises a trench-patterned single crystal semiconductor mesa layer disposed on an underlying support substrate, a thin oxide layer disposed on the top surface of the silicon mesa layer, and a polysilicon etch stop formed on the top surface of said thin oxide layer, said etch stop polysilicon layer having a thickness which is predefined to take into account subsequent wash treatments to which said trench fill oxide will be exposed, so that after such wash treatments the top surface of said trench fill oxide will not be lower than the top surface of said trench-patterned single crystal mesa layer.

7. A method according to claim 6, wherein step (a) comprises oxidizing said trench-patterned semiconductor structure, so as to form a thin oxide layer on the exposed surfaces of the trench and said polysilicon etch stop layer.

8. A method according to claim 5, wherein step (e) comprises non-selectively applying an oxygen-based chemistry etch to said composite photoresist sacrificial layer, so as to etch away said composite photoresist sacrificial layer down to the top surface of the trench fill material layer, thereby obtaining a planarized surface coincident with the top surface of said trench fill material and planarized top surface portions of said reflowed photoresist plugs that have formed in the depressions in the top surface of said trench fill material overlying said trench pattern.

9. A method according to claim 8, wherein step (f) comprises non-selectively applying an $NF_3/CHF_3$ oxide etchant having a high selectivity to oxide to the structure resulting from step (e), thereby enabling a functionally anisotropic etch of oxide within said trench fill layer to terminate at the top surface of said polysilicon etch stop layer, so as to etch said trench fill oxide material layer down to the surface of said polysilicon etch stop layer, leaving a plurality of reflowed photoresist plugs overlying said trench pattern and being coplanar with the top surface of said polysilicon etch stop layer.

10. A method according to claim 5, wherein step (f) comprises non-selectively applying an $NF_3/CHF_3$ oxide etchant having a high selectivity to oxide to the structure resulting from step (e), thereby enabling a functionally anisotropic etch of oxide within said trench fill layer to terminate at the top surface of said polysilicon etch stop layer, so as to etch said trench fill oxide material layer down to the surface of said polysilicon etch stop layer, leaving a plurality of reflowed photoresist plugs overlying said trench pattern and being coplanar with the top surface of said polysilicon etch stop layer.

11. A method according to claim 10, wherein said trench-patterned semiconductor structure comprises a trench-patterned single crystal semiconductor mesa layer disposed on an underlying support substrate, a thin oxide layer disposed on the top surface of the silicon mesa layer, and a polysilicon etch stop formed on the top surface of said thin oxide layer, said etch stop polysilicon layer having a thickness which is predefined to take into account subsequent wash treatments to which said trench fill oxide will be exposed, so that after such wash treatments the top surface of said trench fill oxide will not be lower than the top surface of said trench-patterned single crystal mesa layer.

12. A method according to claim 11, wherein step (a) comprises oxidizing said trench-patterned semiconductor structure, so as to form a thin oxide layer on the exposed surfaces of the trench and said polysilicon etch stop layer.

* * * * *